United States Patent
Werner

(10) Patent No.: US 7,800,176 B2
(45) Date of Patent: Sep. 21, 2010

(54) ELECTRONIC CIRCUIT FOR CONTROLLING A POWER FIELD EFFECT TRANSISTOR

(75) Inventor: Wolfgang Werner, Munich (DE)

(73) Assignee: Infineon Technologies Austria AG, Villach (AT)

( * ) Notice: Subject to any disclaimer, the term of this patent is extended or adjusted under 35 U.S.C. 154(b) by 122 days.

(21) Appl. No.: 12/258,988

(22) Filed: Oct. 27, 2008

(65) Prior Publication Data
US 2010/0102871 A1    Apr. 29, 2010

(51) Int. Cl.
| | |
|---|---|
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |

(52) U.S. Cl. .............. 257/341; 257/328; 257/329; 257/330; 257/367; 257/409; 257/E29.009; 257/E29.017

(58) Field of Classification Search ......... 257/328–330, 257/341, 367, 401, 409, E29.009, E29.017
See application file for complete search history.

(56) References Cited

U.S. PATENT DOCUMENTS

| | | | |
|---|---|---|---|
| 4,941,026 A | 7/1990 | Temple | |
| 5,998,833 A | 12/1999 | Baliga | |
| 7,122,860 B2 * | 10/2006 | Peake et al. ................. | 257/339 |
| 7,521,773 B2 * | 4/2009 | Yilmaz et al. ............... | 257/551 |
| 7,638,841 B2 * | 12/2009 | Challa ........................ | 257/341 |
| 2002/0190282 A1 | 12/2002 | Calafut | |
| 2003/0073287 A1 * | 4/2003 | Kocon ........................ | 438/259 |
| 2005/0082591 A1 * | 4/2005 | Hirler et al. ................. | 257/302 |
| 2006/0006386 A1 | 1/2006 | Hirler et al. | |
| 2006/0049454 A1 * | 3/2006 | Thapar ........................ | 257/330 |
| 2007/0120150 A1 | 5/2007 | Meyer et al. | |
| 2007/0138542 A1 | 6/2007 | Schmidt | |
| 2007/0138544 A1 * | 6/2007 | Hirler et al. ................. | 257/330 |
| 2008/0017920 A1 | 1/2008 | Sapp et al. | |
| 2008/0179670 A1 * | 7/2008 | Willmeroth et al. ......... | 257/340 |
| 2009/0039419 A1 * | 2/2009 | Zundel et al. ............... | 257/328 |
| 2009/0166720 A1 * | 7/2009 | Zundel ........................ | 257/328 |

FOREIGN PATENT DOCUMENTS

| | | |
|---|---|---|
| DE | 10339488 | 4/2005 |
| DE | 102005049593 | 4/2007 |
| DE | 102005052733 | 5/2007 |

* cited by examiner

*Primary Examiner*—Ida M Soward
(74) *Attorney, Agent, or Firm*—Dicke, Billig & Czaja, PLLC

(57) ABSTRACT

An electronic circuit and a method for controlling a power field effect transistor. The electronic circuit includes a power field effect transistor having a semiconductor body, which has a drain zone, a drift zone, a source zone and a bulk zone. The power field effect transistor further includes a gate and a field plate. The field plate is placed adjacent to the drift zone and is isolated from the drift zone. A switch circuitry is provided for electrically connecting the field plate depending on the drain-source voltage such that the field plate is electrically connected to the drain zone, if |UDS|>UT, where UT is a predetermined voltage, and if |UDS|>UT, the field plate is connected to an electrode having an electrode-source voltage UES.

17 Claims, 4 Drawing Sheets

US 7,800,176 B2

ELECTRONIC CIRCUIT FOR CONTROLLING A POWER FIELD EFFECT TRANSISTOR

BACKGROUND

Electronic circuits having a power field effect transistor (FET) with a field plate provide advantages over conventional power field effect transistors. Power FETs include a semiconductor body having a drain zone, a drift zone, a source zone and a body zone. Field plates are introduced to reduce the on-resistor Ron and to reduce switching losses in the Miller phase. The field plate shields the electric field in the drift region from the gate. This structure also increases the breakdown voltage by reducing the carrier concentration in the drift zone. The field plate may also be called shield electrode.

In many applications, a high output capacitance Coss limits the performance of the power field effect transistor. The output capacitance Coss includes the drain-to-source capacitance CDS and the gate-to-drain capacitance CGD. Typically, the drain-to-source capacitance is the dominating part of the output capacitance Coss. The drain-to-source capacitance includes typically the capacitance of the isolating layer between body zone and drift zone and the capacitance of the dielectric between the field plate and the drift zone in series with the capacitance of the depleted

SUMMARY

In one embodiment, an electronic circuit and method for controlling a power field effect transistor (FET) are disclosed. The FET includes semiconductor body having a drain zone, a drift zone, a source zone and a bulk zone. The power FET further includes a gate and a field plate, the field plate being placed adjacent to the drift zone and being insulated from the drift zone. A switch circuitry electrically connects the field plate dependent on the drain-source voltage UDS and a predetermined voltage UT, such that the field plate is electrically connected to the drain zone if |UDS|<UT, and if |UDS|>UT, the field plate is electrically connected to an electrode having an electrode-source voltage UES between the electrode and the source with |UES|<|UDS|.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
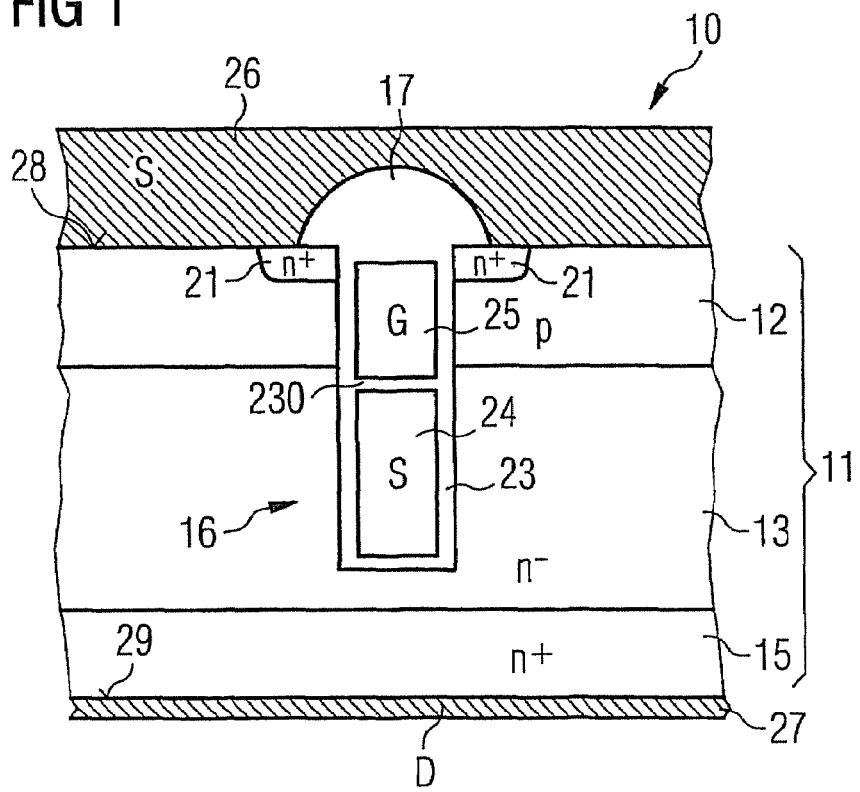
FIG. 1 illustrates a cross section through a section of a field effect transistor.

FIG. 1 illustrates a diagrammatic cross section through a section of a vertical power field effect transistor 10. In this embodiment, the power field effect transistor 10 includes a semiconductor body 11 including regions of semiconductor material, in this case silicon. The semiconductor body 11 extends from a first surface 28, which, in the illustrated embodiment, represents a front-sided surface of the semiconductor body 11, to a second surface 29 opposite the first surface 28. The second surface 29 represents a backside of the semiconductor body 11.

The semiconductor body 11 includes source zones 21, a body zone 12, a drift zone 13 and a drain zone 15, each of which including doped silicon. In FIG. 1, the second surface 29 is illustrated to be at the bottom and the first surface 28 to be provided on the top of the semiconductor body 11. Each of the body zone 12, the drift zone 13 and the drain zone 15 may be described as layers extending horizontally. The body zone 12 is a first layer being arranged at the first surface 28.

The drift zone 13 is provided below the body zone 12 and in contact with the body zone 12. The drain zone 15 is arranged below the drift zone 13 and in contact with the drift zone 13. The lower border of the drain zone 15 is the second surface 29. At the first surface 28, source zones 21 are provided. The source zones are in contact with the body zone 12. The source zones 21 and the drain zone 15 include $n^+$-doped silicon, the body zone includes p-doped silicon and the drift zone 13 includes $n^-$-doped silicon, resulting in an n-channel power field effect transistor 10.

The field effect transistor 10 includes a source electrode 26, a drain electrode 27 and a gate electrode (not illustrated in FIG. 1). The source electrode 26 is arranged above the first surface 28 in mechanical and electric contact with the source zone 21 and the body zone 12. The drain electrode 27 is provided at the second surface 29 in mechanical and electric contact with the drain zone 15.

The source electrode 26 and the drain electrode 27 are formed of highly conductive material such as highly-doped polysilicon or metal. In certain embodiments, metal is used to ease the contacts between the electrodes and bond wires for external contacts. A trench 16 is formed extending from the first surface 28 through the source zones 21, the body zone 12 and an upper part of the drift zone 13. The trench 16 includes a dielectric region 23, a field plate 24 and a gate 25. The field plate 24 is arranged in the lower portion of the trench 16, basically at the same level as the drift zone 13. The field plate 24 is placed adjacent to the drift zone 23. The gate 25 is provided in the upper portion of the trench 16, basically at the same level as the body zone 12.

In the illustrated cross section, the top of the gate 25 is covered by the insulation region 17. At other locations, the gate 25 is covered by conductive material, e.g. doped polysilicon. At these locations, the gate 25 may be electrically contacted by a bond wire.

The field plate 24 is provided below the gate 25. The field plate includes conductive material e.g. medium doped polysilicon. The field plate 24 and the gate 25 are insulated from each other by a dielectric layer 230 which is part of the isolation region 23. The field plate 24 can be contacted from the first surface 28 of the body 11. This contact is arranged in front of or behind the illustrated cross section of FIG. 1. The doping is called high if $10^{18}$ cm$^{-3}$ < $n_d$ ≤ $10^{21}$ cm$^{-3}$, medium $10^{15}$ cm$^{-3}$ < $n_d$ ≤ $10^{18}$ cm$^{-3}$ and light $10^{12}$ cm$^{-3}$ < $n_d$ ≤ $10^{15}$ cm$^{-3}$, where $n_d$ is doping concentration, in other words, the number of atoms of the doping material like Boron or Phosphorus. In an embodiment, the field plate includes semiconductor material having a doping concentration $n_d$ > $2*10^{16}*$cm$^{-3}$.

When the voltage at the gate 25 increases, the transistor turns on, forming conductive channels from the source zone 21, to the drift zone 13 through the body zone 12 along the walls of the trench 16. If the voltage at the gate 25 decreases, the transistor is turned off, the channel is cut off, preventing current from the source zones 21 to the drift zone 13. If the transistor 10 turns on and off, the drain-source voltage UDS changes, whereby the switching speed depends on the output capacitance. During the transitions, the capacitance between the drift zone 13 and the field plate 24 has to be reloaded. This part of the overall output capacitance reduces the switch speed of the transistor. To increase the speed, a switch circuitry is provided to connect the field plate 24 dependent on the drain-source voltage UDS.

In case of |UDS|<UT (where UT is a predetermined voltage), the field plate 24 is connected to the drain electrode 27. In case of |UDS|>UT, the field plate 24 is connected to another electrode E, this other electrode E having an electrode-source voltage UES, where |UES|<|UDS|. As the output capacitance is high especially at low drain-source voltages, it is helpful to reduce the output capacitance for these cases.

In case of an n-channel transistor 10, the drain-source voltage UDS is positive or zero. Accordingly, the field plate 24 is connected to the drain electrode 27 if UDS<UT. The field plate 24 is connected to the other electrode E if UDS>UT, where the other electrode's electrode-source voltage UES<UDS.

In contrast, the drain source voltage UDS of a p-channel transistor is negative or zero. If UDS>UT, the field plate 24 is connected to the drain electrode 27. The field plate 24 is connected the other electrode E if UDS<UT, where the equation UES>UDS holds for the electrode-source voltage UES of the other electrode E. The predetermined voltage UT has a negative value in this case.

The output capacitance Coss of a conventional field effect transistor with a field plate was measured. This output capacitance Coss depends on the drain-source voltage. At low drain-source voltages UDS smaller than 2 V, the output capacitance is more than two times higher than at high drain-source voltages being larger than 20V. Accordingly, the predetermined voltage UT is carefully selected such that it is high enough to reduce the output capacitance at lower drain-source voltages. At the same time, the predetermined voltage should not be too high to ensure that the field plate shields the drift zone from the gate at high drain-source voltages UDS. In the given embodiment, a predetermined voltage of 5 V was considered to fulfill both requirements. The predetermined voltage may also depend e.g. on the temperature. In one embodiment, the predetermined voltage UT is selected to be smaller than the drain-source voltage during an avalanche break-through of a power FET.

Figure 2:
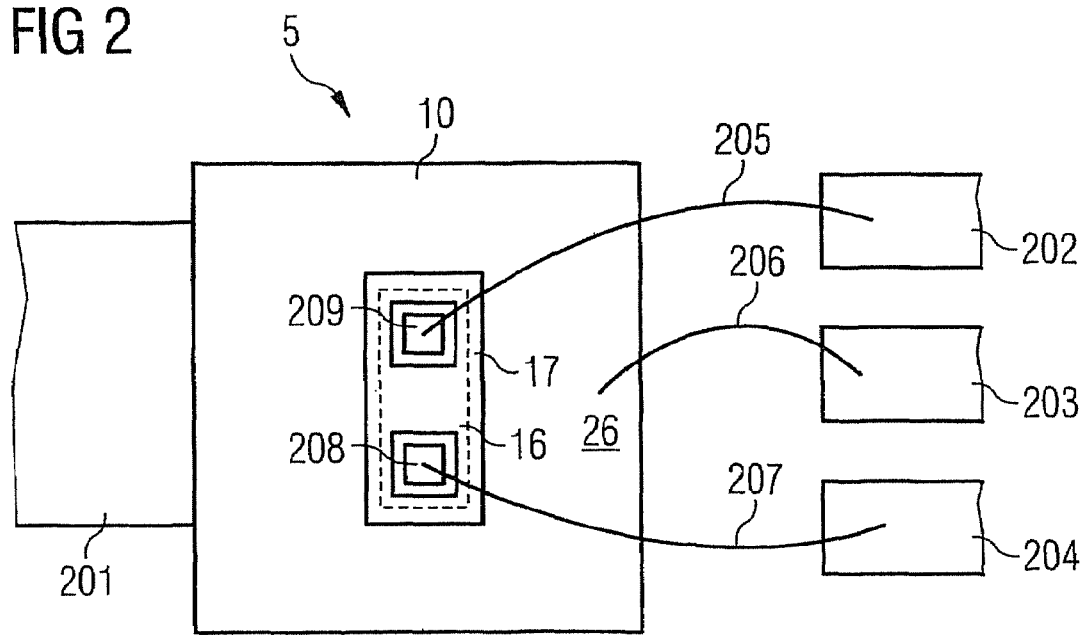
FIG. 2 illustrates a top view of a section of a component having of a field effect transistor.

FIG. 2 illustrates a top view of the section of a component 5 including a power field effect transistor. The component 5 includes a lead frame having a first lead finger 201 being connected to the drain electrode 27 at the backside of the transistor 10, a second lead finger 202 being connected to a gate electrode 209 via a first bond wire 205, a third lead 203 being connected to the source electrode 26 via the second bond wire 206 and a fourth lead 204 being connected to a field plate electrode 208 via the third bond wire 207. The field plate electrode 208 is connected to the filed plate 24 and the gate electrode 209 is connected to the gate 25 through openings of the source electrode 26. The gate 25 and the field plate 24 run below the first surface as indicated by the dashed line.

Figure 3:
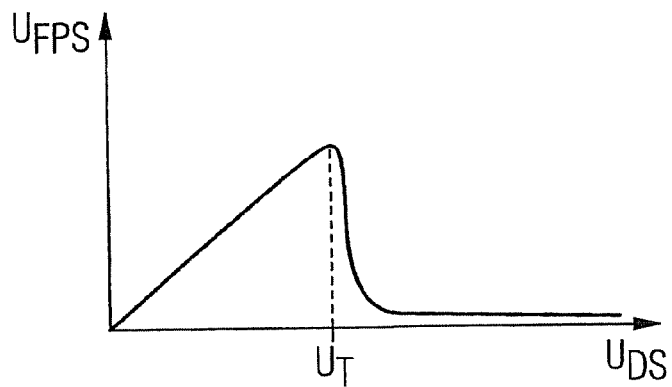
FIG. 3 illustrates the electric potential of the field plate of a field effect transistor as a function of the drain-source voltage.

FIG. 3 illustrates the electric potential of the field plate 24 of a field effect transistor 10 as a function of the drain-source voltage UDS. The diagram illustrates the field plate-source voltage UFPS, which is the voltage between the field plate 24 and the source electrode 26 in dependency of the drain-source voltage UDS between the drain zone 15 and the source zone 21. At a drain-source voltage UDS of 0 V, the field plate-source voltage UFPS is also at 0 V. The field plate-source voltage UFPS increases linearly with the drain-source voltage UDS, such that the field plate-source voltage UFPS basically equals the drain-source voltage UDS until the drain-source voltage UDS reaches the predetermined voltage UT. This predetermined voltage UT may be determined for example at 5 V.

If the drain-source voltage UDS is higher than the predetermined voltage UT, the field plate-source voltage UFPS decreases until it reaches 0 V again. The field plate-source voltage UFPS stays at this low level with rising drain-source voltage UDS.

Figure 4:
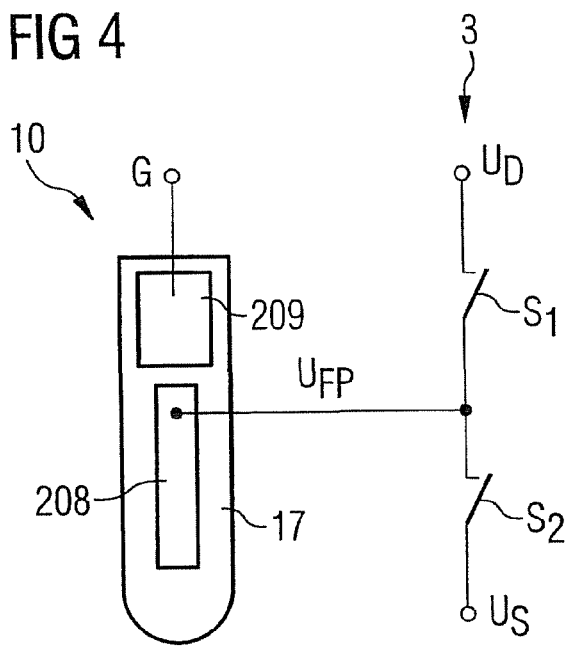
FIG. 4 illustrates a schematic diagram of the switch circuitry for driving the field plate of a field effect transistor.

FIG. 4 illustrates an embodiment of a power field effect transistor 10 and a switch circuitry 3 for driving the field plate 24 of the field effect transistor 10. The field effect transistor 10 is illustrated in a top view like in FIG. 2. The field effect transistor includes the gate electrode 209 to drive the gate 25 from an external contact of the component 5. The field effect electrode 208 provides a connection to the field plate 24 being arranged below the gate 25. The dielectric 17 isolates the field plate electrode 208 and the gate electrode 209 from each other and from the source electrode 26. The field plate electrode 208 is connected to the switch circuitry 3, including a first switch S1 and a second switch S2. The first switch S1 is provided between the drain electrode 27 and the field plate electrode 208, whereas the second switch S2 is arranged between the field plate electrode 208 and the source electrode 26. The electric potential at the drain electrode 27, which equals the electric potential at the drain zone, is marked with UD, that of the source electrode 26 with US and the electric potential of the field plate electrode 208 is marked with UFP.

Figure 5:
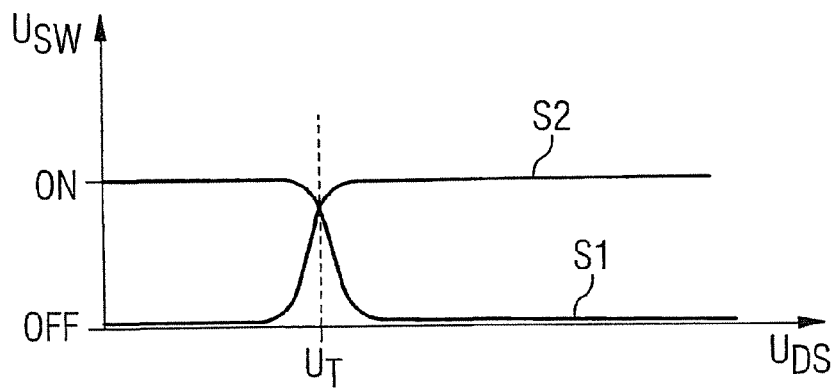
FIG. 5 illustrates the voltages for controlling the switch circuitry of FIG. 4.

FIG. 5 illustrates the voltages with that the switch circuitry of FIG. 4 is controlled. The first switch S1 and the second switch S2 provided as n-channel transistors, they are conductive if their respective gate voltage is at a high level. FIG. 5 illustrates the voltages at the gates of the first switch S1 and of the second switch S2 in dependency of the drain-source voltage UDS. For drain-source voltages UDS, which are smaller than the predetermined voltage UT, the voltage at the gate of the first switch S1 is high, such that the first switch is conductive respectively closed. In this region, the voltage at the gate of the transistor representing the second switch S2 is close to 0 V, leaving the second switch open. In this phase, the field plate electrode 208 is at the same potential as the drain electrode 209.

If the drain-source voltage UDS reaches the predetermined voltage UT, the voltages at the gates of the transistors of the first switch S1 and the second switch S2 change, such that for drain-source voltages UDS higher than the predetermined voltage UT, the second switch S2 is on and the first switch S1 is off. In the second phase, the field plate potential UFP is the same as the source potential US.

Figure 6:
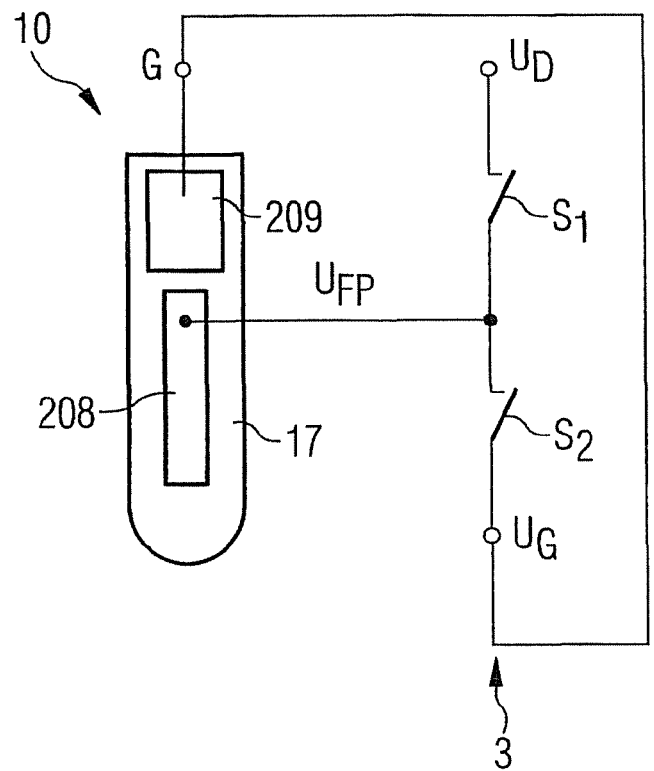
FIG. 6 illustrates a schematic diagram of the switch circuitry for driving the field plate of a field effect transistor.

FIG. 6 illustrates a further embodiment of an electronic circuit including a power field effect transistor with a field plate and with a circuitry for switching the field plate. Elements with the same functions as in the previous figures are marked with the same reference numbers. A difference to the embodiment of FIG. 4 is that the second switch S2 is provided between the field plate 24 and the gate 25. Accordingly, the potential UFP of the field plate electrode 208 changes between the drain potential UD and the gate potential UG. The gate potential is close to the source potential, even if the transistor 10 is switched on. Accordingly, the field plate 24 shields the electric field in the drift region 13 from the gate 25, especially if the drain-source-voltage UDS is high.

FIG. 6 demonstrates that the electrode E, to which the field plate 24 is connected in case of |UDS|<UT, is not necessarily the source electrode. This embodiment illustrates that the gate electrode 209 is the electrode E. However, other electrodes may be used, which also may be driven from externally the electronic circuit.

Figure 7:
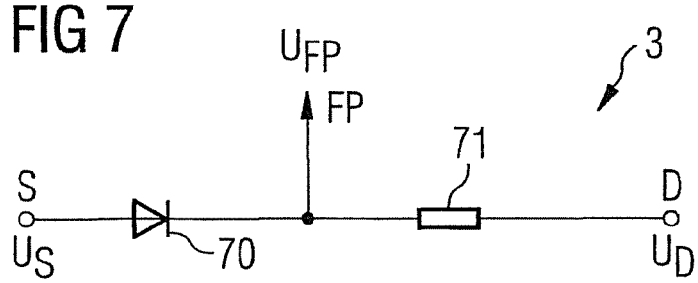
FIG. 7 illustrates a schematic diagram of a further embodiment of a switch circuitry for driving a field plate of a field effect transistor.

FIG. 7 illustrates a further embodiment of the switch circuit 3 for selectively connecting the field plate 24 with the drain electrode 27 or to another electrode E. In this case, the other electrode E is the source electrode 26 as in FIG. 4. Between the source electrode 26 and the field plate electrode 208, a diode 70 is provided, whereby the anode of the diode 70 is connected to the source electrode 26 and its cathode is connected to the field plate electrode 208. Further, a resistor 71 is provided between the field plate electrode 208 and the drain electrode 27. The diode 70 is constructed as a zener diode having a breakdown respectively zener voltage of UT. As long as the drain-source voltage UDS is smaller than the predetermined voltage UT, no current flows through the diode 70. The potential UFP of the field plate 24 equals the potential of the drain UD. If the voltage UDS exceeds UT, the diode 70 breaks through, providing a current through the diode 70. If the resistor 71 is carefully selected, the potential UFP is close to the potential US plus the predetermined voltage UT.

Figure 8:
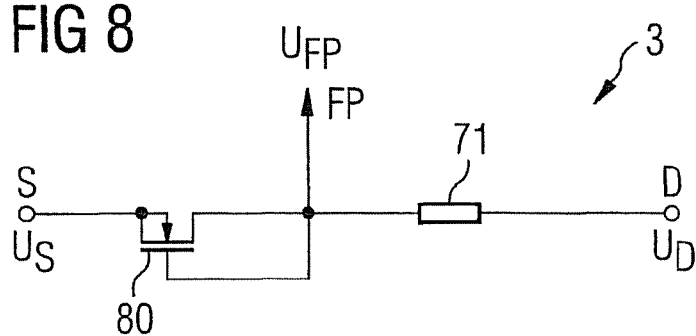
FIG. 8 illustrates a schematic diagram of a further embodiment of a switch circuitry for driving a field plate of a field effect transistor.

FIG. 8 illustrates a further embodiment of a switch circuitry 3 including a transistor 80 and a resistor 71 being serially connected between the source and the drain. The resistor 71 is connected between the drain zone 15 and the field plate 24. The drain of the transistor 80, which is constructed as a n⁻-channel transistor, is connected to the field plate 24 as well as the gate of the transistor 80. The source of the transistor 80 is connected to the source 21 of the transistor 10. The bulk of the transistor 80 is also connected to the source 21 of the transistor 10.

As long as the drain-source voltage UDS is lower than the threshold voltage of the transistor 80, the potential UFP is the same as the potential UD at the drain electrode 27. However, if the drain-source voltage UDS exceeds the threshold voltage of transistor 80, the transistor 80 is turned on, coupling the field plate to the source electrode 26. Accordingly, in this phase the field plate is connected to the source zones 21.

The potential UFP stays at a voltage close to the threshold voltage of transistor 80 as long as the drain-source voltage UDS is higher than the threshold voltage. Accordingly, the filed plate-source voltage is constant for |UDS|<UT.

Figure 9:
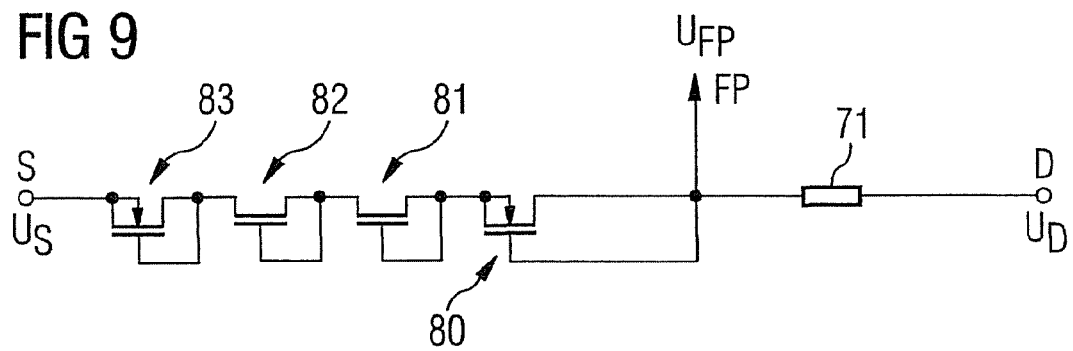
FIG. 9 illustrates a schematic diagram of a further embodiment of a switch circuitry for driving a field plate of a field effect transistor.

FIG. 9 illustrates a further embodiment of a switch circuitry for providing a potential of the field plate 25 in dependency of the drain-source voltage UDS. The predetermined voltage is selected as 4.8 V. The threshold voltage for a given transistor 80 equals only 1.2 V. Thus, a plurality of n-channel transistors 83, 82, 81 and 80 is provided in series between the source electrode 26 and the field plate electrode 208. The transistors 83, 82, 81 and 80 are connected such that each transistor 83, 82, 81 and 80 has its drain and its gate connected. Equally, each transistor 83, 82, 81 and 80 has its source connected to its bulk.

The source of transistor 83 is connected to the source electrode 26 of the power field effect transistor 10, the source of transistor 82 is connected to the drain of transistor 83, the source of transistor 81 is connected to the drain of transistor 82, the source of transistor 80 is connected to the drain of transistor 81 and the drain of transistor 80 is connected to the field plate electrode 208 of transistor 10.

Figure 10:
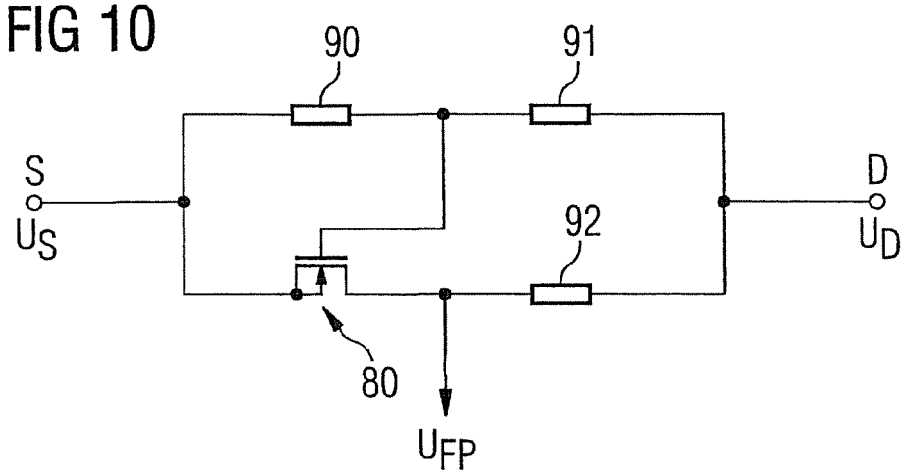
FIG. 10 illustrates a schematic diagram of a further embodiment of a switch circuitry for driving a field plate of a field effect transistor.

FIG. 10 illustrates a further embodiment of a switch circuitry 3 for connecting the field plate 24 depending on the drain-source voltage UDS. The switch circuitry 3 includes a first resistor 90, a second resistor 91, a third resistor 92 and a transistor 80. The resistors 90 and 91 are connected in series between the source electrode 26 and the drain electrode 27 such that a first terminal of the first resistor 90 is connected to the source electrode 208. The second terminal of the first resistor 90 is connected to a first terminal of the second resistor 91. A second terminal of the second resistor 91 is connected to the drain electrode 27.

The transistor 80 and the resistor 92 are also series connected between the source electrode 26 and the drain electrode 27. The source and the bulk of the transistor 80 are connected to the source electrode 26 of the power transistor 10. The gate of transistor 80 is connected to the connection node between the resistors 90 and 91. The drain is connected to the field plate electrode 208. The drain of transistor 80 is connected to the filed plate electrode 208.

R90 is the resistance of the first resistor 90 and R91 is the resistance of the second resistor 91. At the gate of transistor 80 a gate-source voltage UGS of $$UGS = \frac{R90}{R90 + R91} UDS$$

is provided resulting from the voltage divider of the first resistor 90 and the second resistor 91.

If the gate-source voltage UGS is below the threshold voltage UTH of transistor 80, the field plate electrode 208 has the same potential as the drain electrode 27. However, if the drain-source voltage UDS increases, such that the gate-source voltage of transistor 80 exceeds the threshold voltage, the field plate electrode 208 has a potential close to the source potential US.

Figure 11:
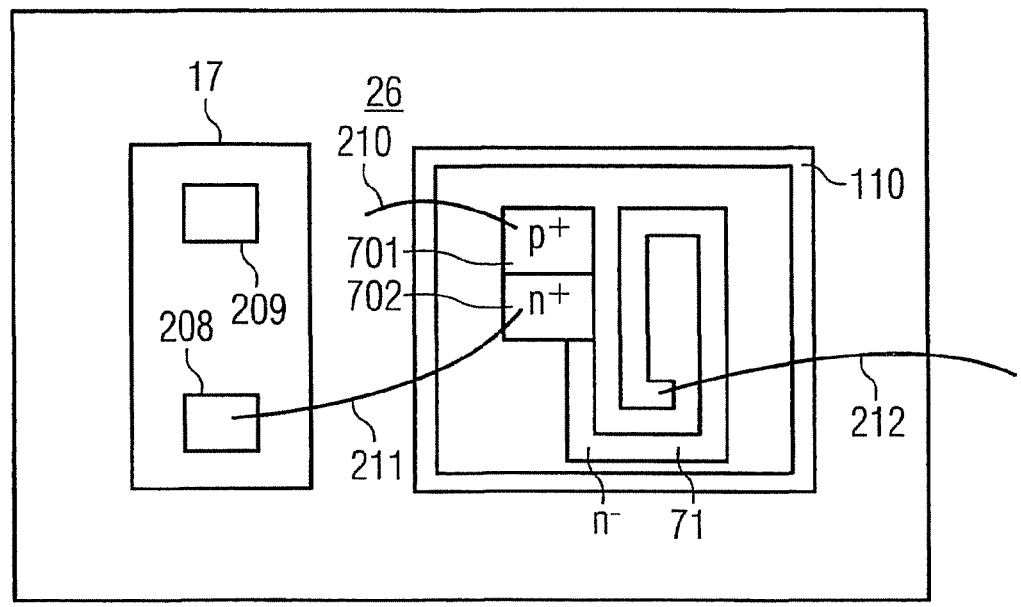
FIG. 11 illustrates a top view of an electronic circuit including a field effect transistor and a switch circuitry.

FIG. 11 illustrates a top view on an electronic circuit including a field effect transistor being integrated in same integrated circuit as the switch circuitry. The electronic circuit includes a field effect transistor 10 that is constructed as a vertical field effect transistor as in FIG. 2. The switch circuitry includes the elements of the embodiment of FIG. 7.

Isolated by a guard ring 110, a diode 70 and a resistor 71 is provided. The diode includes a highly p doped region 701 and a highly n doped region 702. The regions 701 and 702 are in touch forming a diode. The region 701 is connected by the bond wire 210 to the source electrode 26, whereas the region 702 is connected to the field plate electrode 208 by the bond wire 208. The resistor 71 consists of a lightly doped region formed as a meander. The first end of the meander is connected to region 702 and its second end to a bond wire 212. The bond wire 212 is part of a connection to the drain electrode 27, which is at the backside of the field effect transistor 10.

In an alternative embodiment, the field effect transistor 10 is integrated in a first integrated circuit and the switch circuitry is integrated in a second integrated circuit, whereby the first integrated circuit and the second integrated circuit are encapsulated together in one mould compound to be part of one component.

In a further embodiment, the switch circuitry is provided outside the component that includes the integrated circuit with the field effect transistor 10.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic circuit, comprising:
    a power field effect transistor (FET) including a semiconductor body, the semiconductor body including a drain zone, a drift zone, a source zone and a bulk zone, the power FET further including a gate and a field plate, the field plate being placed adjacent to the drift zone and being insulated from the drift zone;
    a switch circuitry for electrically connecting the field plate dependent on the drain-source voltage UDS and a predetermined voltage UT, such that
        the field plate is electrically connected to the drain zone if |UDS|<UT, and
        if |UDS|>UT, the field plate is electrically connected to an electrode having an electrode-source voltage UES between the electrode and the source with |UES|<|UDS|.

2. The electronic circuit of claim 1, wherein the field plate is connected to the source zone, if |UDS|>UT.

3. The electronic circuit of claim 1, wherein the field plate is connected to the gate, if |UDS|>UT.

4. The electronic circuit of claim 1, wherein the switch circuitry includes a series connection of at least one diode and at least one resistor coupled between the drain zone and the source zone, one of the electrodes anode and cathode of the diode being coupled to the source zone and the other of the electrodes anode and cathode of the diode being coupled to the field plate.

5. The electronic circuit of claim 1, wherein the switch circuitry is integrated on the same integrated circuit as the power FET.

6. The electronic circuit of claim 1, wherein the field plate-source voltage UFPS is constant for the |UDS|>UT.

7. The electronic circuit of claim 1, wherein the predetermined voltage UT is smaller than the drain-source voltage during an avalanche break-through of the power FET.

8. The electronic circuit of claim 1, wherein the switch circuitry includes a series connection of at least a diode-connected transistor and at least one resistor between the drain zone and the source zone, the diode-connected transistor being coupled between the source zone and the field plate.

9. The electronic circuit of claim 1, wherein the switch circuitry includes a series connection of at least one transistor and at least one resistor between the drain zone and the source zone, the transistor being arranged to couple the source zone or the drain zone with the field plate dependent on the voltage at a control terminal of the transistor.

10. The electronic circuit of claim 1, wherein the field plate includes semiconductor material having a doping concentration $>2*10^{16}*cm^{-3}$.

11. The electronic circuit of claim 1, wherein the switch circuitry comprises:
    a first switch connected between a drain electrode and the field plate; and
    a second switch connected between the field plate and a source electrode.

12. The electronic circuit of claim 1, wherein the switch circuitry comprises:
    a first switch connected between a drain electrode and the field plate; and
    a second switch connected between the field plate and the gate.

13. The electronic circuit of claim 1, wherein the switch circuitry comprises:
    a diode having an anode connected to a source electrode and a cathode connected to the field plate; and
    a resistor connected between the field plate and a drain electrode.

14. The electronic circuit of claim 13, wherein the diode a zener diode.

15. The electronic circuit of claim 1, wherein the switch circuitry comprises:
    a resistor connected between the drain zone and the field plate;
    a transistor having a drain terminal, a source terminal and a gate terminal, wherein the drain terminal is connected to the field plate and the source terminal connected to the source zone of the FET.

16. The electronic circuit of claim 15, wherein the transistor includes a plurality of transistors connected in series between the source zone of the FET and the field plate, wherein each of the plurality of transistors has its drain terminal connected to its gate terminal.

17. The electronic circuit of claim 1, wherein the switch circuitry comprises:
    first and second resistors connected in series between a source electrode and a drain electrode such that a first terminal of the first resistor is connected to the source electrode, and a second terminal of the first resistor is connected to a first terminal of the second resistor, and a second terminal of the second resistor is connected to the drain electrode;

a third resistor and a transistor connected in series between the source electrode and the gain electrode such that a source terminal of the transistor is connected to the source electrode, a gate terminal of the transistor is connected to the second terminal of the first resistor and the first terminal of the second resistor, and a drain terminal is connected to the field plate.

* * * * *